United States Patent [19]

Hyman, Jr.

[11] 4,277,939
[45] Jul. 14, 1981

[54] ION BEAM PROFILE CONTROL APPARATUS AND METHOD

[75] Inventor: Julius Hyman, Jr., Los Angeles, Calif.

[73] Assignee: Hughes Aircraft Company, Culver City, Calif.

[21] Appl. No.: 27,971

[22] Filed: Apr. 9, 1979

[51] Int. Cl.³ .......................... F02K 9/00; F03H 5/00
[52] U.S. Cl. ........................................ 60/202; 60/204; 60/230; 313/239; 313/352; 313/360
[58] Field of Search .................. 60/202; 313/239, 352, 313/359, 360

[56] References Cited

U.S. PATENT DOCUMENTS

| | | | |
|---|---|---|---|
| 3,500,122 | 3/1970 | Sohl | 60/202 |
| 3,603,088 | 9/1971 | Nakanishi | 60/202 |
| 3,604,209 | 9/1971 | King et al. | 60/202 |
| 3,620,018 | 11/1971 | Banks | 60/202 |
| 3,728,861 | 4/1973 | Pawlik et al. | 313/359 |
| 4,011,719 | 3/1977 | Banks | 313/360 |
| 4,028,579 | 6/1977 | King | 60/202 |

Primary Examiner—Robert E. Garrett
Attorney, Agent, or Firm—Allen A. Dicke, Jr.; W. H. MacAllister

[57] ABSTRACT

Ion chamber 20 receives electrons from cathode 28 and produces ions by electron bombardment in discharge plasma chamber 20. Ions are extracted through ion optics including screen 22 and accelerator electrode 24. Higher ion densities in the center of the discharge chamber are reduced by spoiler 42 which is operated at a potential between cathode and anode potential. This reduces double ionization and central peaking to provide a more uniform ion beam through the optics. By employing laterally positioned spoiler elements beam steering can be accomplished. The ion source is useful wherever a uniform beam profile is desirable as in ion implantation. Controlling the direction of beam density is useful in ion machining and in ion thrusters for space application.

16 Claims, 8 Drawing Figures

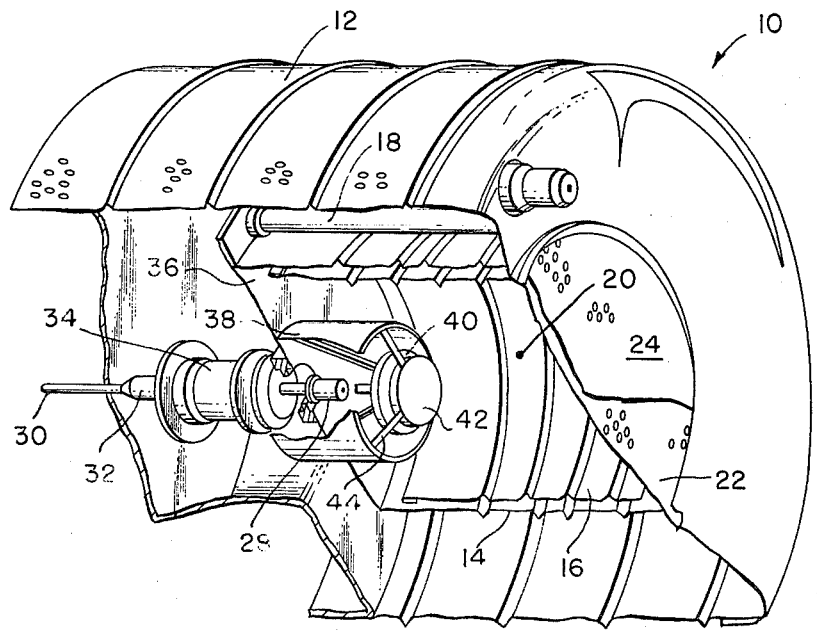

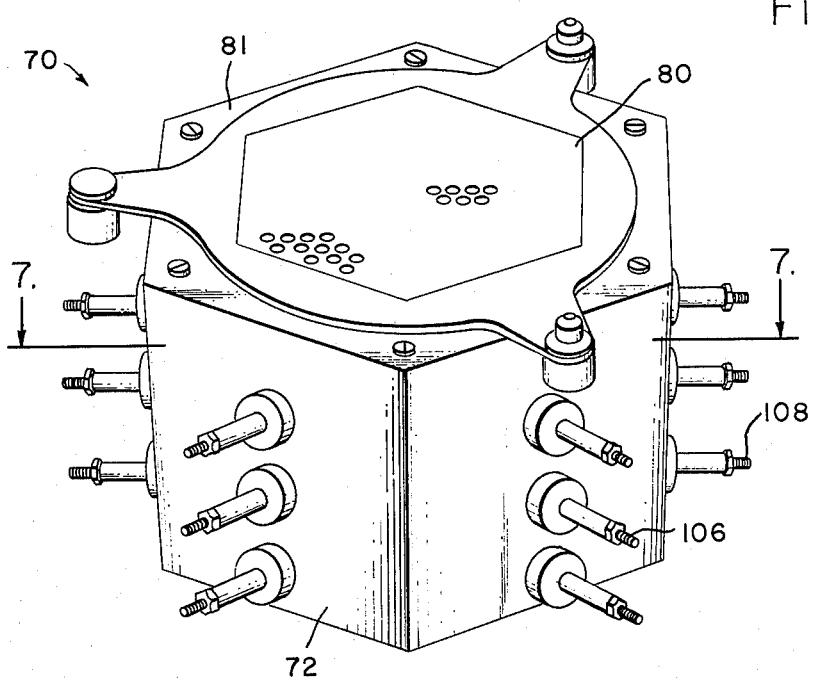
Fig. 6.
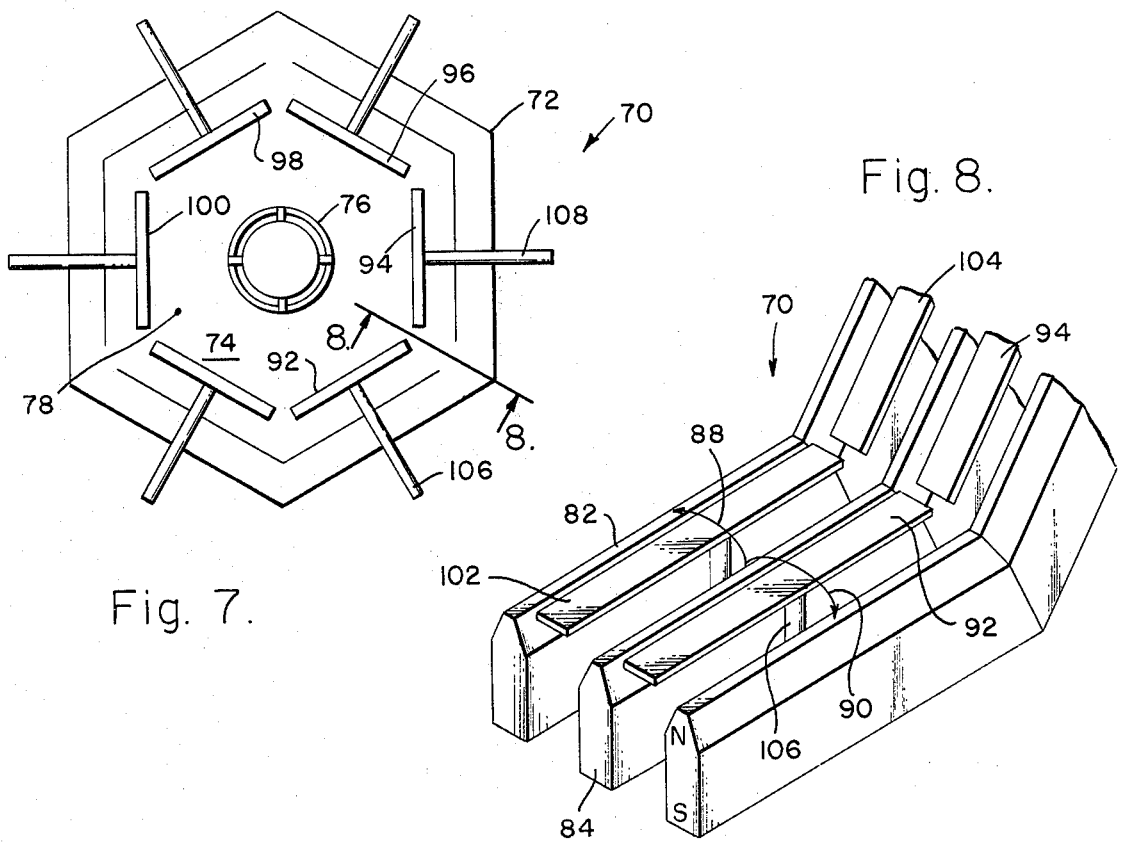
Fig. 7.
Fig. 8.

ION BEAM PROFILE CONTROL APPARATUS AND METHOD

BACKGROUND OF THE INVENTION

This invention is directed to the control of an ion beam from an ion source by controlling the potential on one or more spoiler electrodes in the plasma chamber.

Ion beams are produced in various ways and are employed for various purposes. One manner of producing an ion beam is by electron-bombardment ionization of a gas. An electron bombardment ion source is described as used in an ion thruster and has been described by H. R. Kaufman in NASA Technical Note D-585 dated January 1960 entitled "An Ion Rocket with an Electron-Bombardment Ion Source." A similar disclosure is found in Kaufman U.S. Pat. No. 3,156,090.

Ion beams are used in ion machining operations. The beams are used to etch material surfaces in order to imprint detailed patterns. These patterns can be used for microfabrication of various devices including metal oxide semiconductor microcircuits. Ion machining is also useful in the manufacture of laser mirrors, acoustic delay lines and the like. Where these patterns extend over a large area or where many patterns are imprinted at one time, a uniform beam flux profile is required over the work area.

Another use of ion beams is in ion implantation. In this operation, impurity atoms are implanted in semiconductor substrates by ion beam injection. Uniform ion beam profiles are required to accommodate a large work area.

In another class of devices, the ion beam is discharged out of a space vehicle, as in electric propulsion of spacecraft. In this type of utilization, it is desirable to have a capability to direct the thrust vector over a few degrees of azimuth. This is useful in spacecraft where the center of gravity may change and it is helpful to maintain the thrust vector in a particular position with respect to the center of gravity. Furthermore, adjusting the direction of the thrust vector is helpful for attitude control operations. Such ion beam thrusters are of the type referred to in the H. R. Kaufman disclosure mentioned above. In such a thruster, a screen electrode and an accelerator electrode are provided at the open end of the plasma chamber to extract and accelerate the beam. Plasma density distribution in the plasma chamber controls the net thrust vector direction.

In such ion beam thrusters, discharge chamber sputtering erosion represents a major failure hazard. The sputtering results primarily from ion bombardment of cathode potential surfaces by doubly charged ions generated near the center of the discharge chamber. The higher density of doubly charged ions near the central region of the discharge chamber is greatly reduced by reducing the central peaking of the plasma density in the beam.

Reduction of central parking is also useful to relax the requirement on beam handling capability (or preveance density $P = J/V^{3/2}$) of the beam-extraction system. Although the total ions extracted by the beam-extraction system is typified by the average current density, the system must be designed to be capable of operating at the highest value of current density which occurs locally at the center of the plasma.

SUMMARY OF THE INVENTION

In order to aid in the understanding of this invention it can be stated in essentially summary form that it is directed to an ion beam control apparatus wherein at least one electrode is positioned in the plasma chamber and is approximately at anode potential to decrease the plasma density in the center of the discharge chamber. The method comprises the removal of energetic electrons (through collection by the electrode) from the center of the discharge chamber to reduce the ion generation rate at the center of the discharge chamber.

It is thus an object of this invention to provide an ion beam profile control apparatus wherein the profile of the ion beam as it is extracted from the plasma discharge chamber wherein the ions are produced can be controlled to reduce the center peaking of the beam.

It is another object to provide a method whereby the ion beam profile is controlled so as to adjust the ion current laterally at different positions around the center line.

Other objects and advantages of this invention will become apparent from the study of the following portion of this specification, the claims and the attached drawings.

BRIEF DESCRIPTION OF THE DRAWINGS

FIG. 1 is a perspective view, with parts broken away and parts taken in section of an ion beam source of the electron bombardment type which has therein the ion beam profile control apparatus in accordance with this invention and can be operated in accordance with the method of this invention.

FIG. 2 is a side elevational view with parts broken away, of the back of the discharge chamber including the cathode cup, cathode, baffle and the profile control electrodes in accordance with the first preferred embodiment of this invention.

FIG. 3 is a similar view of the second preferred embodiment of the apparatus of this invention.

FIG. 4 is a front elevational view of the apparatus of FIG. 2.

FIG. 5 is a schematic electrical diagram of the apparatus, showing the manner in which the various parts are biased.

FIG. 6 is an external perspective view of another ion source incorporating the ion beam profile control apparatus of this invention.

FIG. 7 is a schematic section therethrough on reduced scale.

FIG. 8 is a perspective view of the electrodes as seen generally from along the line 8—8 of FIG. 7.

DESCRIPTION OF THE PREFERRED EMBODIMENTS

FIG. 1 illustrates ion thruster 10 which comprises exterior ground screen 12 which is normally close to spacecraft potential when the thruster is employed on a spacecraft, or to ground potential in earth testing. Anode 16 is positioned within housing 14. Magnets, such as magnet 18 shown in FIG. 1 provide radially diverging axial magnetic lines within the anode 16. Anode 16 is in the form of a tubular cylinder and the axis thereof defines the axis of ion thruster 10. The outlet end of discharge plasma space 20 is closed by screen electrode 22 which is at housing 14 potential. Accelerator electrode 24 is positioned downstream of screen electrode 22 and is connected to power supply 26, see FIG. 5, which applies the necessary negative accelerating potential. Both the screen electrode 22 and the accelerator electrode 24 are shown as dished inward in FIG. 5.

Cathode 28 is supplied with an ionizable material. In the present case of the device being a thruster, the material being supplied is mercury, or the like. Liquid mercury supply line 30 supplies liquid mercury to mercury vaporizor 32 which is connected through voltage isolator 34 to cathode 28. As is seen in FIG. 2, cathode 28 extends through backplate 36 of housing 14. Cathode cup 38 is mounted on backplate 36 and contains cathode 28. The cathode and the cathode cup are positioned on the axis of thruster 10. Cup 38 contains baffle 40 which partially closes the open outlet end of the cup, so as to establish a suitable electrical impedance between the cathode-cup 38 region and the region of the discharge chamber 20, and to protect cathode 28 against bombardment by ions from the plasma in discharge chamber 20. Baffle 40 is positioned within the open end of cup 38 and is at the potential of housing 14, which is the positive potential.

Plasma spoiler 42, in its first embodiment illustrated in FIGS. 1 and 2, is a metallic disc mounted on support legs 44 by which it is mounted in front of baffle 40. The support legs insulate the disc from the remaining structure. The spoiler 42 is preferably of smaller diameter than baffle 40 and is circular in shape in a circular structure such as ion thruster 10. The potential of spoiler 42 is controlled by power supply 26 to which the spoiler is connected by means of conductor 46 which extends through one of support legs 44. The potential of spoiler 42 is from anode potential down almost to the potential of housing 14 or potential of the cathode 28. By biasing the spoiler electrode, energetic electrons are swept out of the central region of the plasma, thus diminishing the processes which tend to cause central peaking. The peaking is caused in the usual ion thruster 10 since all of the electrons are injected near the center line, the electrons are most energetic near the center line and the electrons experience a decrease in current density as they radially expand toward the anode due to the cylindrical geometry. While baffle 40 forces the electrons to enter the main discharge at a small distance away from the source axis, it is only partially successful in flattening the ion beam profile. Furthermore, ions generated near the anode may also be attracted toward the center line by self-consistent electrical field set up by the electron-rich central region. This further contributes to central peaking of the ion beam profile. The effect of the spoiler 42 is maximized when it is at anode potential.

The reduction of central peaking of the ion beam is useful and important in several applications. In ion machining, ion beams are employed to etch material surfaces in order to imprint detailed patterns used for microfabrication of various devices including MOS microcircuits, laser mirrors, acoustic delay lines, and the like. Where these patterns extend over a large area or where many patterns are imprinted at one time, a uniform beam profile is required over the work area. The spoiler of the present invention aids in obtaining uniformity. The reduction of the center beam peak is also useful in ion implantation where impurity atoms are implanted in semiconductor devices by ion beam injection. Uniform beam profiles are required to accommodate a large work area.

Another useful result of the employment of the spoiler 42 of the present invention is the reduction in discharge chamber sputtering. Discharge chamber sputter erosion represents a major failure hazard in electric propulsion applications. This sputtering results primarily from ion bombardment of cathode potential surfaces by doubly charged ions (the great majority of beam ions are singly charged) generated near the center of the discharge chamber. The central peaking of doubly charged ions occur for the same reasons described above as the central peaking of the main ion beam, and thus the density of doubly charged ions is greatly reduced by the use of plasma spoiler electrode 42.

Spoiler 48 illustrated in FIGS. 3, 4 and 5 is of the same nature as spoiler 42. Spoiler 48 is in the same general environment and thus the adjacent structures are identified by the same reference characters as for spoiler 42. Baffle 50 is the same as baffle 40, in its being located at the front of cup 38. Baffle 50 is mounted on a plurality of support legs, two of which are seen in 52 and 54. In FIG. 3, the support legs are seen to be hollow and carry therethrough support legs 56 and 58 of spoiler 48. Furthermore, spoiler 48 is divided into four segments 60, 62, 64 and 66, each of which are supported by its own leg. The four segments are electrically isolated from each other and are each individually connected by means of the legs to power supply 26. By control of power supply 26, as from control system 27, each of the segments can have its potential individually controlled so that by application of potential toward anode potential from the cathode 28 potential the plasma peaking in that quadrant is reduced. By differential potential control between the segments, beam steering or vectoring can be accomplished. In the segment where the baffle segment potential is closer to ground potential, the beam will be stronger and where the baffle segment potential is closer to anode potential, the beam will be weaker. In this way, ion beam thrust vectoring can be accomplished. In combination with a dished screen and dished accelerator electrode pair, thrust vectoring is achieved by employing this array of spoiler electrodes where each segment is located eccentrically with respect to the thruster center line. In electric propulsion applications, it is desirable to have a capability to vector the thrust over a few degrees of azimuth for tracking the spacecraft center of gravity or for attitude control applications.

FIGS. 6, 7 and 8 illustrate ion thruster 70 which has housing 72. Backplate 74, see FIG. 7, carries cathode 76, which is preferably in a cup with a baffle, the same as illustrated in FIG. 2, although optionally without spoiler 42. Housing 72 defines an axis perpendicular to the drawing sheet in FIG. 7, with the axis defining the center line of housing 72 and defining the center of the plasma chamber 78 therein. Extraction ion optics including a screen electrode 81 and an accelerator electrode 80 are provided on the axis at the downstream end of the chamber for extraction and acceleration of an ion beam from the plasma in chamber 78.

Bar shaped permanent magnets 82, 84 and 86, see FIG. 8, arranged around the periphery within housing 72. In view of the six sided nature of the housing 72, six magnets make a string which extends all the way around the interior of the housing. Furthermore, there are least three of these magnet hexagons in the axial direction, as indicated in FIG. 8. The bar magnets alternate in their polarity so as to produce magnetic cusps such as the cusps illustrated in FIG. 8 at 88 and 90. The magnets produce a magnetic field which confines the electrons to the plasma chamber 78 in order to produce ionization of the gas therein. As a result of this confinement, ionization takes place.

Anodes are placed within the magnetic cusps around plasma chamber 78. The anodes are arranged in hexagons, with anodes 92, 94, 96, 98 and 100 shown in FIG. 7. Furthermore, anodes are arranged in the axial direction, with anodes 102 and 104 illustrated in FIG. 8. As seen in FIG. 8, the anodes lie in the magnetic cusps. Individual electrical connections are provided to the anodes, such as connections 106 and 108 illustrated in FIGS. 6 and 7.

Each of the anodes is individually connected to the anode power supply. By making anodes on one side of the thruster less positive, the beam intensity decreases on that side for beam steering. Thus, thrust vectoring is achieved when a dished set of extraction electrodes 80 and 81 is provided. A power supply is connected to each anode, with each anode individually controllable with respect to the potential of housing 72. Of course, the cathode is also provided with cathode potential so as to provide the necessary potentials through the system. If a spoiler 42 is fitted to the cathode 76, then the spoiler will also receive its own potential, toward the anode potential from the cathode potential. However, the cusped field thruster 70 of FIG. 6 inherently results in a beam profile which is less peaked in the center so that the spoiler 42 is less likely to be needed. Since thrust vectoring is achieved by individual anode potential control, then the employment of a spoiler 48, which has its own thrust vectoring potential, is also less likely to be needed.

The use of a segmented anode can also be employed with the Kaufman thruster design by separating the cylindrical anode 16 into segments which are biased separately by power supply 26. In such an arrangement, beam vectoring can also be accomplished.

By these means, a beam profile which has less central peaking is achieved, and a beam which is vectorable is also achieved. This invention having been described in its preferred embodiments, it is clear that this invention is susceptible to numerous modifications and embodiments within the ability of those skilled in the art and without the exercise of the inventive faculty. Accordingly, the scope of this invention is defined by the scope of the following claims.

What is claimed is:

1. An ion source comprising:
   a plasma chamber having an axis and having a housing, an electron source adjacent one end of said axis and ion extraction optics adjacent the other end of said axis, anode means around said axis and around said plasma chamber for applying anode potential to said plasma chamber;
   means for supplying ionizable material to said plasma chamber;
   a cathode for supplying electrons to said plasma chamber for movement toward said anode means for ionizing the ionizable material as the electrons pass from said cathode to said anode means;
   a spoiler positioned between said cathode and said extraction optics, means for biasing said spoiler said spoiler having a plurality of segments and each of said segments of said spoiler being individually connected to said biasing means to individually bias said spoiler segments more positive than said housing so that the reduction of peaking around said axis can be individually controlled by each of said segments to control the uniformity of ion beam flux through said extraction optics.

2. An ion source comprising:
   a plasma chamber having an axis and having a housing, an electron source adjacent one end of said axis and ion extraction optics adjacent the other end of said axis, anode means around said axis and around said plasma chamber for applying anode potential to said plasma chamber;
   means for supplying ionizable material to said plasma chamber;
   a cathode for supplying electrons to said plasma chamber for movement towards said anode means for ionizing the ionizable material as the electrons pass from said cathode to said anode means;
   a spoiler positioned between said cathode and said extraction optics, said spoiler having a plurality of segments at least some of said segments being laterally positioned with respect to said axis, each of said segments of said spoiler being individually connected to said biasing means to individually bias said spoiler segments more positive than said housing to control peaking of ionization along said center line to control the distribution of ion beam flux through said extraction optics.

3. The the ion source of claim 2 wherein said ion source serves as a part of an ion thruster.

4. An ion source comprising:
   a plasma chamber having an axis and having a housing, an electron source adjacent one end of said axis and ion extraction optics adjacent the other end of said axis, anode means around said axis and around said plasma chamber for applying anode potential to said plasma chamber;
   means for supplying ionizable material to said plasma chamber;
   a cathode for supplying electrons to said plasma chamber for movement towards said anode means for ionizing the ionizable material as the electrons pass from said cathode to said anode means;
   a spoiler position between said cathode and said extraction optics, said spoiler having a plurality of segments, a power supply individually connected to each of said segments to individually control the potential thereof to control flux distribution of ion beam flux through said extraction optics, and a control system connected to said power supply for individual control of each of said segments.

5. An ion source comprising a plasma chamber housing having an axis, said plasma chamber having ion optics at the downstream end of said axis and having a cathode at the upstream end of said axis;
   anode means within said ion chamber housing for accepting electrons from said cathode, magnet means around said plasma chamber housing for extending the path of electrons from said cathode to said anode means, means for supplying ionizable fluid to said plasma chamber so that the ionizable fluid is ionized by electron bombardment, with the ions being extracted by said ion optics, the improvement comprising;
   a spoiler positioned on said axis, said spoiler being segmented into spoiler portions, with some of said spoiler portions being positioned laterally with respect to said axis, and means for biasing said spoiler individually connected to each of said spoiler segments for individually biasing said spoiler segments so that differential laterally biasing of said spoiler segments can be achieved for controlling lateral ion density within said plasma chanber and thus controlling lateral density of ions from said ion axis.

6. The ion source of claim 5 wherein said ion source is part of an ion thruster which has a dished beam extraction system so that thrust vectoring is achieved.

7. An ion source comprising;

walls defining a plasma chamber, said plasma chamber having an axis, ion optics toward one end of said axis and an electron source toward the other end of said axis;

anode means around said chamber and magnet means for producing a magnetic field within said chamber and means for supplying ionizable fluid to said chamber so that said ionizable material is ionized by electron bombardment as electrons pass from said cathode to said anode with the electron path being lengthened by the magnetic field produced by said magnet means, the improvement comprising:

said anode means being formed of a plurality of segments, some of said segments being laterally positioned with respect to said axis and anode potential means connected to each of said segments for individually controlling anode potential for controlling electron path length within said plasma chamber and thus controlling ion density laterally with respect to said axis.

8. An ion source comprising:

walls defining a plasma chamber, said plasma chamber having an axis, ion optics toward one end of said axis and an electron source toward the other end of said axis;

anode means around said chamber and magnet means for producing a magnetic field within said chamber and means for supplying ionizable fluid to said chamber so that said ionizable fluid is ionized by electron bombardment as electrons pass from said cathode to said anode with the electron path being lengthened by the magnetic field produced by said magnet means, the improvement comprising:

said anode means being formed of a plurality of individual anode segments positioned around said plasma chamber, some of said segments being laterally positioned with respect to said axis and anode potential means connected to each of said segments for individually controlling anode potential for controlling electron path length within the said plasma chamber and thus controlling ion density laterally with respect to said axis.

9. The ion source of claim 8 wherein said anode segments comprise a plurality of segments arranged along said axis as well as around said axis.

10. The ion source of claim 8 wherein said magnet means comprises a plurality of bar magnets arranged circumferentially around said plasma chamber.

11. The ion source of claim 10 wherein said bar magnets are of alternate polarity on the sides of said bars facing said plasma chamber so that magnetic field cusps are produced within said plasma chamber.

12. An ion source comprising:

walls defining a plasma chamber, said plasma chamber having an axis, ion optics toward one end of said axis and an electron source toward the other end of said axis;

anode means around said chamber and magnet means for producing a magnetic field within said chamber and means for supplying ionizable fluid to said chamber so that said ionizable material is ionized by electron bombardment as the electrons pass from said cathode to said anode with the electron path being lengthened by the magnetic field produced by said magnet means, the improvement comprising:

said anode means being formed of a plurality of individual anode segments positioned around said plasma chamber, anode potential means connected to each of said segments for individually controlling anode potential for controlling electron path length within said plasma chamber and thus controlling ion density laterally with respect to said axis, said ion source forming a part of an ion thruster so that potential control of said anode controls beam vectoring.

13. An ion source comprising:

walls defining a plasma chamber, said plasma chamber having an axis, ion optics toward one end of said axis and an electron source toward the other end of said axis;

anode means around said chamber and magnet means for producing a magnetic field within said chamber and means for supplying ionizable fluid to said chamber so that said ionizable material is ionized by electron bombardment as electrons pass from said cathode to said anode with the electron path lengthened by the magnetic field produced by said magnet means, the improvement comprising:

said anode means being formed of a plurality segments, some of said segments being laterally positioned with respect to said axis, and control means connected to said plurality of individual anode sements for individually controlling the potential thereof for controlling electron path length within said plasma chamber and thus controlling ion density laterally with respect to said axis.

14. The method of operating an ion source having a cathode, an anode and a segmented central spoiler in a plasma chamber comprising the steps of:

applying potential to the cathode and anode to cause electrons to spiral through the plasma chamber for ionizing ionizable gas within the plasma chamber;

adjusting the potential of the spoiler segments adjacent the center of the discharge chamber laterally of the center thereof to laterally adjust peaking for beam vectoring.

15. The method of claim 14 wherein there is a control system and further including the step of:

providing control signals from the control system to adjust the potential of the spoiler.

16. The method of claim 14 further including the step of:

operating the ion source with the potential of the spoiler such as to reduce the central peaking of the ion concentration with respect to average concentration and thus reduce the center ion current with respect to average ion current; and operating the ion source with the central ion current substantially at maximum current density so that the ion source is operated at higher total current.

* * * * *